(12) United States Patent
Wilk et al.

(10) Patent No.: US 6,552,388 B2
(45) Date of Patent: Apr. 22, 2003

(54) HAFNIUM NITRIDE GATE DIELECTRIC

(75) Inventors: Glen D. Wilk, Dallas, TX (US); Robert M. Wallace, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/171,932

(22) Filed: Jun. 14, 2002

(65) Prior Publication Data

US 2002/0177293 A1 Nov. 28, 2002

Related U.S. Application Data

(62) Division of application No. 09/506,240, filed on Feb. 17, 2000, now Pat. No. 6,436,801.
(60) Provisional application No. 60/121,856, filed on Feb. 26, 1999.

(51) Int. Cl.$^7$ ................. H01K 21/3205; H01L 21/4763
(52) U.S. Cl. ................. 257/324; 438/591; 438/761; 438/762; 438/765; 438/769; 257/213; 257/288; 257/310; 257/410; 257/411

(58) Field of Search .................. 257/213, 288, 257/310, 324, 410, 411; 438/591, 761, 762, 765, 769

(56) References Cited

U.S. PATENT DOCUMENTS

| | | | |
|---|---|---|---|
| 6,013,553 A | 1/2000 | Wallace | 438/287 |
| 6,020,243 A | 2/2000 | Wallace et al. | 438/287 |
| 6,084,279 A | 7/2000 | Nguyen et al. | 257/412 |
| 6,291,867 B1 | 9/2001 | Wallace et al. | 257/410 |

*Primary Examiner*—David Nelms
*Assistant Examiner*—Renee' R Berry
(74) *Attorney, Agent, or Firm*—David Denker; Wade James Brady, III; Frederick J. Telecky, Jr.

(57) ABSTRACT

A field effect semiconductor device comprising a high permittivity hafnium (or hafnium-zirconium) nitride gate dielectric and a method of forming the same are disclosed herein. The device comprises a silicon substrate 20 having a semiconducting channel region 24 formed therein. A hafnium (or hafnium-zirconium) nitride gate dielectric layer 36 is formed over this substrate, followed by a conductive gate 38. Hafnium (or hafnium-zirconium) nitride gate dielectric layer 36 has a dielectric constant is significantly higher than the dielectric constant of silicon dioxide.

14 Claims, 2 Drawing Sheets

HAFNIUM NITRIDE GATE DIELECTRIC

This application is a divisional of application Ser. No. 09/506,240, filed Feb. 17, 2000, now U.S. Pat. No. 6,436,801 which claims priority from provisional Appl. No. 60/121,856, filed Feb. 26, 1999.

FIELD OF THE INVENTION

This invention relates generally to semiconductor device structures and methods for forming such, and more specifically to such structures and methods related to gate dielectrics for field effect devices formed on integrated circuits.

BACKGROUND OF THE INVENTION

Semiconductor devices such as field effect transistors are common in the electronics industry. Such devices may be formed with extremely small dimensions, such that thousands or even millions of these devices may be formed on a single-crystal silicon substrate or "chip" and interconnected to perform useful functions in an integrated circuit such as a microprocessor.

Although transistor design and fabrication is a highly complex undertaking, the general structure and operation of a transistor are fairly simple. With reference to FIG. 1, a simplified field effect transistor is shown in cross-section. In a field effect transistor a portion of the substrate (or epi-layer) 100 near the surface is designated as the channel 120 during processing. Channel 120 is electrically connected to source 140 and drain 160, such that when a voltage difference exists between source 140 and drain 160, current will tend to flow through channel 120. The semiconducting characteristics of channel 120 are altered such that its resistivity may be controlled by the voltage applied to gate 190, a conductive layer overlying channel 120. Thus by changing the voltage on gate 190, more or less current can be made to flow through channel 120. Gate 190 and channel 120 are separated by gate dielectric 180; the gate dielectric is insulating, such that between gate 190 and channel 120 little or no current flows during operation (although "tunneling" current is observed with thin dielectrics). However, the gate dielectric allows the gate voltage to induce an electric field in channel 120, giving rise to the name "field effect transistor."

Generally, integrated circuit performance and density may be enhanced by "scaling", that is by decreasing the size of the individual semiconductor devices on a chip. Unfortunately, field effect semiconductor devices produce an output signal that is proportional to the length of the channel, such that scaling reduces their output. This effect has generally been compensated for by decreasing the thickness of gate dielectric 180, thus bringing the gate in closer proximity to the channel and enhancing the field effect.

As devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally from a few layers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities.

Realizing the limitations of silicon dioxide, researchers have searched for alternative dielectric materials which can be formed in a thicker layer than silicon dioxide and yet still produce the same field effect performance. This performance is often expressed as "equivalent oxide thickness": although the alternative material layer may be thick, it has the equivalent effect of a much thinner layer of silicon dioxide (commonly called simply "oxide"). Many, if not most, of the attractive alternatives for achieving low equivalent oxide thicknesses are metal oxides, such as tantalum pentoxide, titanium dioxide, and barium strontium titanate.

Researchers have found formation of such metal oxides as gate dielectrics to be problematic. At typical metal oxide deposition temperatures, the oxygen ambient or oxygen-containing precursor required to form them tends to also oxidize the silicon substrate, producing an oxide layer at the interface between the substrate and the gate dielectric. The presence of this interfacial oxide layer increases the effective oxide thickness, reducing the effectiveness of the alternative gate dielectric approach. The existence of the interfacial oxide layer places an ultimate constraint on the performance of an alternative dielectric field effect device.

SUMMARY OF THE INVENTION

The present invention includes a semiconductor device structure utilizing either a hafnium nitride gate dielectric layer, and a method for making the same. This method also encompasses gate dielectrics formed from nitrides of mixtures of Hf and Zr. With the present invention, a hafnium (or hafnium-zirconium) nitride gate dielectric may be formed with a dielectric constant substantially higher than that of either conventional thermal silicon dioxide or silicon nitride dielectrics. Thus, the metal (Hf or Hf—Zr) nitride dielectric layer may be made substantially thicker than a conventional gate dielectric with equivalent field effect. Additionally, the presence of nitrogen, in at least a partial thickness of the gate dielectric, helps to prevent the diffusion of boron—such as from a boron-doped polysilicon gate electrode—to the channel region.

Conventional researcher wisdom has been to avoid nitrogen-based compounds for gate dielectrics. This aversion is partly based on the tendency of silicon nitride to reduce electron mobility in the channel. Additionally, integrated circuit manufacturing researchers tend to hesitate before investigating the addition of new materials, and especially material types, for mass produced integrated circuits. Additionally, the leakage current of hafnium nitride—for many Hf/N ratios—is significantly higher than the leakage current of many other approaches, such as $SiO_2$ and silicon nitride.

In spite of this discouragement, our investigations suggest that $Hf_xN_{1-x}$ is stable next to Si for a wide range of ratios. However, the resistivity drops—with a corresponding increase in leakage current—as the percentage of Hf (or Hf—Zr) increases. For x>0.5, the leakage current appears to be too high to meet the requirements in the industry's roadmap for the future. In our preferred approach, where x is approximately 0.3, the leakage current meets the roadmap requirements, while providing a dielectric constant near 9 or 10. Also, For $x \geq 0.3$, then the hafnium nitride layer seems to remain amorphous, even if processed at temperatures up to 900 degrees C. These understandings and our research into understanding the silicon/nitride interface has allowed us to recognize the usability of hafnium nitride gate dielectrics.

We also investigated dielectrics with a formula of $(Hf_z/Zr_{1-z})_xN_{1-x}$. These compounds are also stable next to Si for a wide range of ratios. However, the (Hf—Zr)N dielectrics tend to exhibit higher leakage currents than a HfN dielectric with the same ratio x. We have found that the leakage current is acceptable for $(Hf_z/Zr_{1-z})_xN_{1-x}$ compounds with x=0.3 and z=0.8. Again the resistivity drops as the percentage of Hf—Zr increases.

In one aspect of this invention, a method of fabricating a semiconductor device is disclosed that includes providing a single-crystal silicon substrate, which usually includes structures, such as a channel region between a source and a drain; forming a metal nitride gate dielectric layer on the substrate, and forming a conductive gate overlying the gate dielectric layer. This metal can be hafnium, or a hafnium-zirconium mixture.

In one hafnium-based approach, the hafnium nitride dielectric layer is formed by forming hafnium on the substrate, and annealing the formed metal in a non-oxidizing atmosphere including nitrogen, such as atomic nitrogen or $NH_3$ to form hafnium nitride. The hafnium can also be nitrided by remote plasma nitridation.

In another approach, the hafnium nitride dielectric layer is formed by sputtering hafnium nitride onto the substrate, thus forming a hafnium nitride layer on the substrate.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

This application describes the embodiments in terms of a hafnium nitride dielectric. However, due to its chemical similarity, hafnium-zirconium mixtures can be used in place of hafnium in most of these embodiments. In some embodiments, these mixtures will be substantially pure Hf, with only small amounts of Zr included. Due to leakage current concerns, we prefer mixtures with less than about 20% Zr (as compared to Hf). For the purposes of this application, a Hf—Zr mixture refers to mixtures that have a Hf to Zr ratio greater than about 80%. In general, both hafnium nitride and hafnium-zirconium nitride provide high dielectric constants and good chemical stability. Usually, we prefer HfN because of simplicity, its somewhat higher dielectric constant, and that it may be more stable than hafnium-zirconium nitride.

Figure 1:
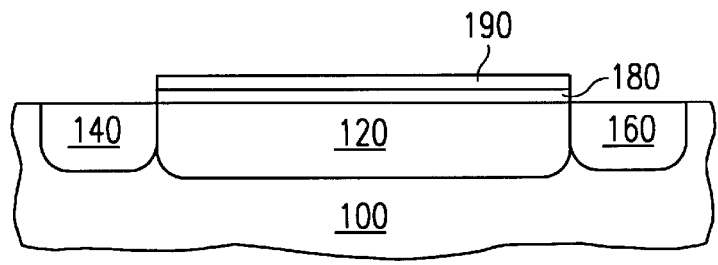
FIG. 1 is a cross-sectional view of a typical prior art integrated circuit field effect transistor.
Figure 2:
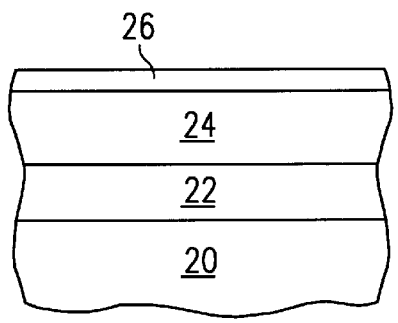
FIGS. 2–5 are cross-sectional views of several semiconductor devices, illustrating different surfaces appropriate for deposition of a hafnium nitride gate dielectric according to the invention.

The preferred embodiments of the invention may be fabricated on a silicon substrate, as described herein. Although it is not required to practice this invention, it is conventional to use a Si(100) substrate. The description of these embodiments begins, as shown if FIG. 2, after formation of an optional epitaxial Si layer 22 on substrate 20 and implantation of an active channel region 24 in epitaxial layer 22 (or substrate 20, if no epi-layer is used). The description assumes that a protective or native silicon oxide region 26 (preferably comprising less than 1 nm of oxide) overlies channel 24 in the region of interest. Such a silicon oxide layer may be formed by heating a clean substrate to 600–700° C. for approximately 30 seconds, in an oxygen ambient of ~$10^{-3}$ Torr. Processes for reaching this step in fabrication are all well known in the art, as are various equivalents to which the present invention is applicable.

The particular embodiment employed for forming a hafnium nitride gate dielectric will dictate whether silicon oxide region 26 will be either left in place and used in the formation of an interfacial silicon-oxynitride layer, removed such that the dielectric layer may be directly formed on the underlying silicon, or removed and replaced with a passivation layer designed to inhibit interaction of the substrate in the hafnium nitride deposition process.

Figure 3:
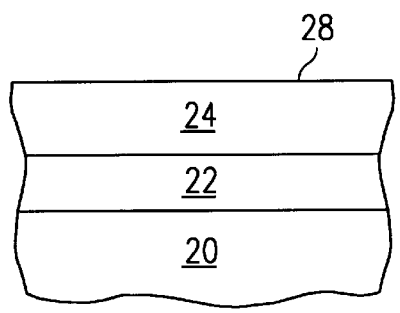
Figure 4:
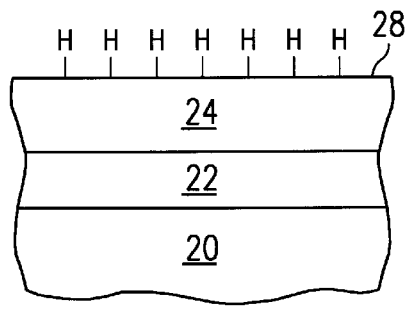

The immediately following description relates to the preparation of the substrate for deposition of nitride-forming materials, and is applicable to the specific embodiments presented thereafter. There are two preferred starting surfaces for the invention if silicon oxide region 26 is to be removed. Region 26 may be removed so as to leave either a clean, bare upper surface 28 as shown in FIG. 3, or a hydrogen-terminated surface 28 as shown in FIG. 4. If oxide region 26 is removed, the bare surface is preferred to the hydrogen-terminated surface if chemical reaction of the highly reactive bare Si surface can be prevented, e.g. by processing in ultrahigh (less than ~$10^{-8}$ Torr) vacuum until a point in the particular process where exposure to oxygen can be tolerated. Otherwise, the bare Si surface should be terminated with a suitable passivant, such as hydrogen, which inhibits reoxidation, yet may be readily removed at an appropriate point in the process.

The method of oxide removal is not believed to be critical to the practice of the invention, as long as a clean, oxide-free surface 28 can be maintained until an overlying deposition is performed. One preferred method of performing removal of oxide 26 is by exposure to wet HF, for example by dipping the substrate in dilute HF for 30 seconds and rinsing in deionized water. This both removes the native oxide and hydrogen terminates the surface. Another preferred method is by exposure to HF vapor; this provides similar results, but may be used. e.g., in a cluster tool to further prevent reoxidation or contamination of the surface. Either of these approaches may include other appropriate stripping chemicals, with HF or a $NH_4F$ solution being preferred as a last step to provide termination.

Several other methods produce a non-terminated surface 28, as shown in FIG. 3. One such method with particular applicability to cluster-tool practice is Si flux desorption. It has been found that below $10^{-8}$ Torr and at 780° C., an Si flux of preferably 1.5 Å/sec for about 600 seconds not only removes native oxide, but produces an atomically smooth, stepped surface that may have advantages for thin gate dielectrics. The alternative is simple desorption by heating of the substrate to high temperature in vacuum or in an $H_2$ ambient. It is believed, however, that the Si-flux method results in a superior surface structure. In any of these methods, if the substrate will not be kept in ultrahigh vacuum until an overlying deposition is completed, surface 28 may be hydrogen terminated, e.g. by exposure to atomic hydrogen produced by a plasma or hot filament in an $H_2$ ambient.

Surface 28 may also be passivated with an ultrathin layer, such as a silicon oxynitride layer, that is not, strictly speaking, an oxide of silicon. Such layers can act as a diffusion barrier and provide oxidation resistance to the substrate during further processing of the integrated circuit. If an oxynitride layer is used, the preferred method of oxynitridation is by exposure to NO. This layer is preferably less than 1 nm thick, and more preferably less than 0.5 nm thick. Although the reasons are not well understood, this ultrathin passivation layer greatly reduces oxidation of the silicon substrate during further processing. Even with these benefits, the dielectric constant reductions usually dictate against using this oxynitride layer.

Although the effective dielectric constant of an oxynitride layer is difficult to measure, it is believed to be in the range of 5 to 6. Thicknesses less than 0.5 nm are even more preferred, in order to lessen the effect of the passivation layer's relatively lower dielectric constant on equivalent oxide thickness. Nitrogen incorporation can improve the effectiveness of an oxynitride layer as an oxidation barrier. One way to enhance nitrogen incorporation is to post-anneal a NO-formed oxynitride layer in an ambient that provides atomic nitrogen. This N anneal is not generally recommended in this HfN approach, because the disadvantages of additional N next to the silicon/silicon oxynitride interface usually outweigh the benefits obtained.

Oxynitrides produced by other methods are not believed to work as well. For instance, $N_2O$ processes result in a much smaller incorporation of N than NO processes. $NH_3$ processes require a pre-existing $SiO_2$ film, and thus a uniform sub-nanometer oxynitride film appears to be difficult to achieve using $NH_3$. Additionally, $NH_3$ annealing apparently incorporates undesirable hydrogen into the film structure.

Figure 5:
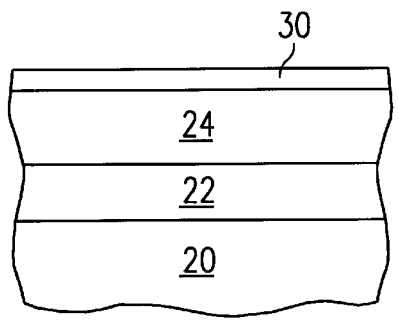

If this oxynitride passivation is chosen, the following NO process can be applied to the present invention is as follows. The substrate is cleaned to remove the pad oxide. As a final step in the cleaning, the substrate is dipped in dilute HF for 30 seconds, and rinsed in deionized water. The substrate is then placed in a reaction chamber, which is then evacuated to $3 \times 10^{-8}$ Torr, and then the substrate is heated to 500° C. to remove the hydrogen passivation from the substrate surface. The substrate is heated to 700° C., and NO at 4 Torr is introduced into the chamber for 10 seconds to form the thin oxynitride passivation layer. FIG. 5 depicts a passivation layer 30, typically a silicon oxynitride passivation layer.

Once the substrate has been prepared to provide either a clean Si surface, an oxide layer, or a protective barrier layer as described above, a hafnium (or hafnium-zirconium) nitride gate dielectric is formed on the substrate by one of several methods. Several of these methods are described below.

We chose hafnium nitride and hafnium-zirconium nitride due to their stability next to silicon and higher permittivity. The oxygen-free nature of these metal nitrides allows process flows that minimize the possibility of forming an interfacial $SiO_2$ layer between the metal nitride and the underlying substrate. Additionally, HfN reacts with oxygen to form hafnium oxynitride, and hafnium oxynitride seems to have a heat of formation that is more negative than the heat of formation of silicon dioxide. Thus, unintended oxygen diffusion will often form stable hafnium oxynitride, before it reaches the HfN—Si interface. In general, hafnium (or hafnium-zirconium) nitride can be formed as either a polycrystalline or an amorphous film. Generally, polycrystalline films will have better dielectric constant. However, amorphous films generally have higher breakdown performance, form a better diffusion barrier, and have lower interface state densities. Also, with many of the embodiments for formation of a hafnium (or hafnium-zirconium) nitride dielectric according to the present invention, formation of an amorphous film tends to be easier than formation of a polycrystalline film because of the uniform stoichiometry required for a polycrystalline film.

The following embodiments are most readily performed for thin gate dielectrics. In general, these methods may be preferred when the equivalent oxide thickness is less than about 2.5 nm, and will find increasing preference for equivalent oxide thicknesses of 2 nm and below. For a HfN composition with a dielectric constant near 10, this will correspond to physical thicknesses of about 10 nm to 8 nm, respectively.

Embodiment 1

In one embodiment according to the invention, a hafnium-zirconium or hafnium nitride gate dielectric is formed by depositing Hf or Hf—Zr on a clean Si surface, nitriding this metal layer, and annealing this structure. In this embodiment, a substrate such as shown in either FIG. 3 or FIG. 4 is used. If surface 28 is hydrogen passivated as shown in FIG. 4, the substrate can be briefly heated to above 500° C. in vacuum or an inert ambient to remove the passivation.

Figure 6:
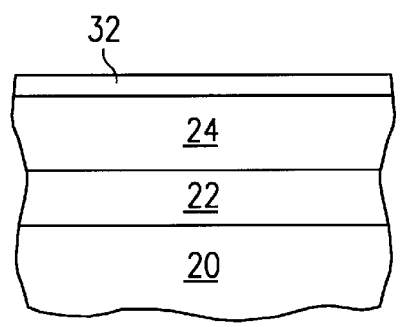
FIGS. 6–10 are cross-sectional views of a semiconductor device during fabrication according to various embodiments of the invention.

Referring to FIG. 6, a metal layer 32 (e.g. hafnium) is deposited directly on surface 28, e.g. by sputtering, evaporation, chemical vapor deposition (CVD) or plasma CVD. The figures show that surface 28 is the surface of channel region 24. However, formation of a metal nitride layer on the surface of epitaxial layer 22 or substrate 20 follows the same method. Layers 20 and 24 will be used interchangeably below, except where the context shows a distinction is meant.

Sputter deposition is preferably done with a low-energy plasma system, such as collimated or long-throw sputtering. Low deposition rates (e.g. on the order of a few angstroms per minute) may be useful, as the total thickness to be deposited is small and uniformity is desired. For an 8" wafer, deposition may be completed in a system with a base pressure of $\sim 10^{-8}$ Torr, an operating pressure of $\sim 10^{-3}$ Torr, and a separation between the sputter gun and the wafer of 16 inches, and the wafer may be rotated to improve uniformity. Ar is an acceptable sputter gas, and the wafer may be maintained at a temperature of 400–600° C. during deposition.

As an alternative to sputtering, metal layer 32 may be deposited by evaporation from an e-beam source onto a substrate at 500–600° C., with a net deposition rate on the order of tenths of angstroms to a few angstroms per minute. The substrate is preferably rotated to improve uniformity.

Figure 8:
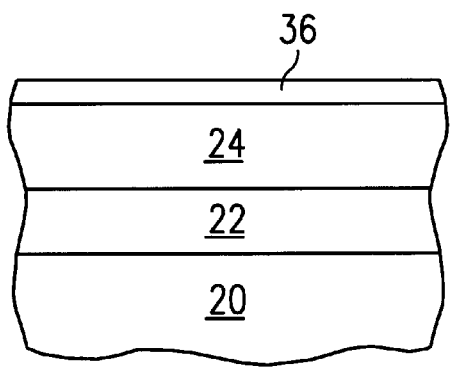

Referring now to FIG. 8, metal layer 32 (from FIG. 6) is converted to a hafnium (or hafnium-zirconium) nitride layer 36 by nitridation. Process control is critical during this step, as under-nitridation will result in decreased resistivity and diffusion resistance and over-nitridation may result in decreased capacitance for layer 36. Several processes are available for this step. The metal can be converted into hafnium nitride by direct exposure to an nitrogen atmosphere, such as $N_2$ or atomic nitrogen.

Another alternative for nitridation is a remote plasma nitridation. In this approach, nitrogen ions are implanted into the metal layer. Preferably, the nitrogen-containing substance is either $N_2$, $NH_3$, NO, $N_2O$, or a mixture thereof, and the plasma is preferably a high density plasma. The wafer can be unbiased in which case the ionized substances are accelerated by the plasma potential (which is typically on the order of 20 Volts) and then implanted into the insulating surface. A bias voltage can be applied to the wafer to further accelerate the ions from the plasma and implant them deeper into the insulating layer. Either a DC or an RF bias voltage can be used to bias the wafer. This nitridation can be performed with the following processing conditions: the plasma density is between $1 \times 10^{10}$ to $1 \times 10^2$ cm$^{-3}$; the nitrogen is on the order of 1 to 100 sccm; the process pressure is preferably on the order of 1 to 50 mTorr; the temperature is preferably around 70 to 900K; the substrate (wafer) bias is on the order of 0 to 50 Volts; and the duration of exposure is between 1 to 60 seconds.

This plasma nitridation approach will usually require a silicon oxynitride passivation layer 30, in order to provide some process margin against nitridation of the underlying channel region 24.

Generally, a high temperature anneal of hafnium (or hafnium-zirconium) nitride layer 36 is selected to densify—if desired, crystallize—the film after low temperature nitridation. For example, the substrate may be densified by annealing in Ar for 20 seconds at 750° C. This densifying anneal may be done in either an inert or a reducing environment, with a reducing environment particularly useful where metal layer 32 was deposited by CVD using halogens.

Figure 9:
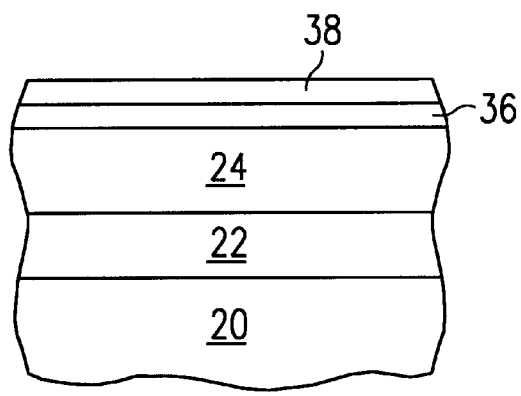

Finally, with reference to FIG. 9, conductive gate 38 is deposited over the hafnium nitride gate dielectric 36. Processes for depositing gate 38 are well known in the art; gate 38 may be formed, by way of example, of doped polysilicon, metal, or a conductive metal oxide.

In other approaches, polysilicon gates often require an additional passivation layer between dielectric 36 and gate 38 to prevent reduction of dielectric 36 and oxidation of gate 38 at the interface. Although a passivation layer is allowable, the polysilicon generally does not react with the underlying hafnium (or hafnium-zirconium) nitride in a way that tends to destroy the dielectric properties of the layer. Thus, many of the compatibility benefits obtained at the bottom interface are also available at the top interface. Additionally, the nitrogen in the dielectric 36 will greatly reduce boron migration through the dielectric 36 to the substrate 20 when a polysilicon gate is doped.

Embodiment 2

In a second embodiment according to the invention, a hafnium (or hafnium-zirconium) nitride gate dielectric is formed by depositing hafnium (or hafnium-zirconium) on a substrate in a nitrogen ambient, followed by annealing. This embodiment preferably utilizes a substrate prepared by one of the methods corresponding to FIGS. 2, 3, or 4, and the metal may be deposited by one of the methods described in embodiment 1, with the following differences.

Figure 10:
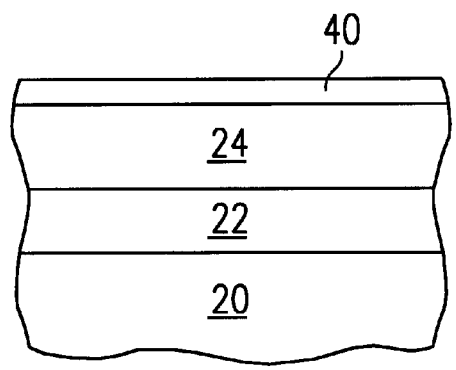

Referring to FIG. 10, a nitrided hafnium-zirconium (or Hf) layer 40 may be deposited on a clean Si surface by sputtering Hf—Zr or Hf, as described above. However, some amount of controlled nitrogen activity is used to at least partially nitridize layer 40 as hafnium-zirconium is supplied to the substrate. For example, $N_2$ or atomic nitrogen may be introduced near the substrate during sputtering with Ar, with a nitrogen flow rate of about one-tenth that of the Ar flow rate. For a metal deposition rate of 0.1 nanometers per minute, the nitridation gas may be introduced concurrently with or shortly before the start of the deposition process. This pre-introduction may form a thin, interfacial silicon nitride layer, but will prevent the formation of an unnitrided hafnium layer.

If the hafnium is introduced by the evaporation method, the nitridation gas is preferably added near the substrate. To achieve near complete nitridation of the deposited metal, ~5–10 Torr of $N_2$ may be used for a reasonable range of metal deposition rates, including 0.1 nm/min.

Figure 7:
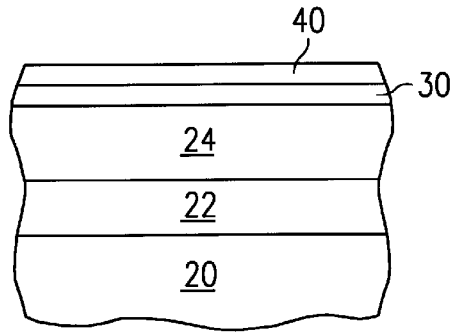

In this approach, the reactions between the hafnium (or hafnium-zirconium) nitride and the underlying layer can produce a graded layer. One variation on this method is shown in FIG. 7, wherein layer 40 is deposited over a silicon oxynitride layer 30. In such an embodiment, nitrogen activity during the Hf deposition may be reduced, and an interfacial hafnium silicon-nitride layer 36 may be formed by "stealing" nitrogen and silicon from layer 30 and/or "giving" Hf to the silicon-oxynitride layer 30. The grading of the structure may be adjusted by adjusting the relative initial thicknesses of layers 30 and 40.

A grading effect can also be achieved by reducing the nitrogen content at the beginning of the hafnium deposition process, and gradually increasing the nitrogen concentration. This will provide a relatively metal-rich layer (e.g. $Hf_{0.5}N_{0.5}$ or $Hf_{0.6}N_{0.4}$) near the Si surface, thus increasing the dielectric constant and minimizing electron mobility degradation due to the nitrogen. The relatively nitrogen rich layer (e.g. $Hf_{0.2}N_{0.8}$ or $Hf_{0.3}N_{0.7}$) near the gate interface will provide high resistivity and reduce leakage currents.

Embodiment 3

This embodiment generally follows the method of embodiment 1, except that the HfN deposition follows a more controlled process.

In the best-controlled—and thus often most preferred—approach, a HfN target is sputtered onto a bare Si surface, in an inert atmosphere. This target should have the desired HfN or (Hf—Zr)N composition. Compositions between about $Hf_2N_8$ and $Hf_{0.4}N_{0.6}$—such as $Hf_3N_7$—seem to provide the best balance between high dielectric constant and low leakage current.

Sputter deposition is preferably done with a low-energy plasma system, such as collimated or long-throw sputtering. Low deposition rates (e.g. on the order of a few angstroms per minute) may be useful, as the total thickness to be deposited is small (on the order of 9 nm) and uniformity is desired. Although many different setups and operational parameters will form high quality HfN films, we will describe one useful setup here. For an 8" wafer, deposition may be completed in a system with a base pressure of ~$10^{-8}$ Torr, an operating pressure of ~$10^{-3}$ Torr, and a separation between the sputter gun and the wafer of 16 inches, and the wafer may be rotated to improve uniformity. Ar is an acceptable sputter gas, and the wafer may be maintained at a temperature of 400–600° C. during deposition.

Though sputtering is usually preferred, there are other methods of directly forming a HfN layer on a Si substrate. These methods include depositing metal layer 32 by evaporation from an e-beam source onto a substrate at 500–600° C., with a net deposition rate on the order of tenths of angstroms to a few angstroms per minute. The substrate is preferably rotated to improve uniformity.

Another alternative method for forming the HfN layer is CVD or plasma CVD using appropriate precursors, such as hafnium tetrachloride and $N_2$. Again, with these methods low deposition rates and temperatures (600° C. and lower) can be useful, and a downstream plasma type reactor is preferred to a reactor where the plasma is generated at the substrate.

Embodiment 4

In the approaches mentioned above, the nitrogen in the dielectric will sometimes degrade the electron mobility in the underlying channel. In this instance, it can be allowable to apply an ultra-thin silicon dioxide layer on the Si substrate, before applying the HfN (or (Hf—Zr)N) dielectric, as described above. Although this lowers the effective dielectric constant of the gate dielectric stack, the resulting dielectric stack provides a workable compromise design. The stack provides improved dielectric properties over a SiO$_2$ gate dielectric, or a SiO$_2$—Si$_3$N$_4$ stack, yet does not inhibit electron mobility.

The present invention is not limited by the specific embodiments described herein. Although a particular substrate and type of device have been described herein for clarity, this invention has application to Si-based devices generally which modify the semiconducting characteristics of an active region using the field effect of an overlying conductive region. Various other combinations of the described steps may be used to produce hafnium (or hafnium-zirconium) nitride gate dielectrics, and such are intended to fall within the scope of this invention.

What is claimed is:

1. An integrated circuit having a field effect device fabricated thereon, the field effect device comprising:

a single-crystal silicon semiconducting channel region;

a metal nitride gate dielectric overlying the channel region where the metal nitride is selected from the group of hafnium nitride and mixtures of hafnium nitride and zirconium nitride; and a conductive gate overlying the gate dielectric.

2. The integrated circuit of claim 1, wherein the gate dielectric is amorphous.

3. The integrated circuit of claim 1, including an interfacial layer of silicon dioxide between the metal nitride gate dielectric and the silicon channel region.

4. An MIS field-effect transistor, comprising:

a source and a drain disposed in a silicon layer and near a first surface of the silicon layer;

a hafnium nitride gate dielectric disposed on the first surface, wherein the hafnium nitride gate dielectric covers at least part of the space between the source and drain;

a gate electrode disposed adjacent the hafnium nitride gate dielectric and opposite silicon layer.

5. The transistor of claim 4, further comprising a thin silicon dioxide layer disposed between and immediately adjacent to both the silicon layer and the hafnium nitride gate dielectric.

6. An integrated circuit made by the method of providing a single-crystal silicon substrate;

forming a gate dielectric layer on the substrate, where the gate dielectric layer is formed from a metal nitride selected from the group of hafnium nitride and hafnium-zirconium nitride; and forming a conductive gate overlying the gate dielectric layer.

7. An integrated circuit made by the method of providing a single-crystal silicon substrate;

forming a gate dielectric layer on the substrate, where the gate dielectric layer is formed from a metal nitride selected from the group of hafnium nitride and hafnium-zirconium nitride; and forming a conductive gate overlying the gate dielectric layer;

wherein the forming a metal nitride gate dielectric layer step comprises:

depositing a metal on the substrate, where the metal is selected from the group of hafnium and mixtures of hafnium and zirconium; and exposing the metal to a non-oxidizing atmosphere including nitrogen during the deposition step, thereby forming a metal nitride layer on the substrate.

8. An integrated circuit made by the method of providing a single-crystal silicon substrate;

forming a gate dielectric layer on the substrate, where the gate dielectric layer is formed from a metal nitride selected from the group of hafnium nitride and hafnium-zirconium nitride; and forming a conductive gate overlying the gate dielectric layer;

wherein the forming a metal nitride gate dielectric layer step comprises:

forming a metal on the substrate, where the metal is selected from the group of hafnium and mixtures of hafnium and zirconium; and annealing the formed metal in a non-oxidizing atmosphere including nitrogen, thereby forming a metal nitride layer on the substrate.

9. The integrated circuit of claim 1, wherein the hafnium nitride gate dielectric directly contacts the silicon channel region.

10. The transistor of claim 4, wherein the hafnium nitride gate dielectric directly contacts the silicon layer.

11. The integrated circuit of claim 1, wherein the wherein the metal nitride is substantially hafnium nitride.

12. The transistor of claim 6, wherein the metal nitride is substantially hafnium nitride.

13. The transistor of claim 7, wherein the metal nitride is substantially hafnium nitride.

14. The transistor of claim 8, wherein the metal nitride is substantially hafnium nitride.

* * * * *